United States Patent
Su et al.

(10) Patent No.: US 7,905,628 B2
(45) Date of Patent: Mar. 15, 2011

(54) LED DEVICE HAVING A HUMIDITY SENSOR

(75) Inventors: Ay Su, Jhongli (TW); Ying-Chieh Liu, Jhongli (TW); Chi-Yuan Lee, Jhongli (TW); Shuo-Jen Lee, Jhongli (TW)

(73) Assignee: Yuan Ze University, Taoyuan County (TW)

( * ) Notice: Subject to any disclaimer, the term of this patent is extended or adjusted under 35 U.S.C. 154(b) by 287 days.

(21) Appl. No.: 12/292,905

(22) Filed: Dec. 1, 2008

(65) Prior Publication Data

US 2010/0061099 A1     Mar. 11, 2010

(30) Foreign Application Priority Data

Sep. 8, 2008   (TW) ................................ 97134347 A

(51) Int. Cl.
*F21V 33/00*   (2006.01)
*F21V 23/04*   (2006.01)

(52) U.S. Cl. ........ 362/253; 362/276; 362/802; 362/800; 257/98; 257/100

(58) Field of Classification Search .................. 362/253, 362/276, 411, 394, 295, 800, 802, 257; 257/79, 257/98, 100, 103

See application file for complete search history.

(56) References Cited

U.S. PATENT DOCUMENTS

| 5,349,267 A | * | 9/1994 | Brassier et al. | ............... 362/466 |
| 2006/0022214 A1 | * | 2/2006 | Morgan et al. | .................. 257/98 |

* cited by examiner

*Primary Examiner* — Bao Q Truong
(74) *Attorney, Agent, or Firm* — Rosenberg, Klein & Lee

(57) ABSTRACT

A light emitting diode (LED) device having a humidity sensor includes an LED portion, a humidity sensor and an external device. This LED portion has a base, a boning layer, an LED chip, and a sealing portion. The LED ship is adhered on the base by the bonding layer. The sealing portion encloses the LED chip. This humidity sensor has a transmission element. This humidity sensor is to detect humidity condition in the LED portion. The external device is to monitor humidity condition and variation in the LED portion. It can monitor the internal condition in the LED portion and is possible to detect both the temperature and humidity simultaneously.

5 Claims, 4 Drawing Sheets

LED DEVICE HAVING A HUMIDITY SENSOR

BACKGROUND OF THE INVENTION

1. Field of the Invention

The present invention relates to an LED device having a humidity sensor. Particularly, it relates to an LED device having a humidity sensor that can monitor the internal condition in the LED portion and is possible to detect both the temperature and humidity simultaneously.

2. Description of the Prior Art

The conventional light emitting diode (LED) includes a LED chip adhered on a metal plate (usually is made by copper that has better heat dissipation characteristics). The adhering method is to add a silicon resin (mixed with silver powder) or ceramic material as a bonding layer between the LED chip and the metal plate. So, the bonding layer has a good electrical conductivity and a great thermal conductivity. When the ceramic material is used, addition metal leads (or connecting lines) must be added. After the LED chip is adhered on the metal plate, a transparent lens made by silicon resin can be formed to cover this LED chip.

However, during the manufacturing procedure of the above-mentioned conventional LED, it is difficult to detect or monitor the following items:

[1] the adhering condition between the LED chip and the metal plate;

[2] the durable times about temperature fluctuating cycles (repeating high temperature and low temperature);

[3] the heat resistance and aging effect of the silicon resin mixed with silver powder;

[4] the adhering condition about the silicon resin during a fabricating process;

[5] the separating condition (such as a crack or a gap) after using a period of time (when such separating condition occurs, small bubbles might generate so that the light quality is lowered, and the product life becomes shorter due to the oxygenized metal lines.

The LED aging or malfunction are caused by the following reasons.

[1] The LED chip is out of order. As shown in FIG. 1, when the silicon resin (mixed with silver powder) 912 is overheated or aging, the LED chip 913 will gradually separate from the metal plate 911. Hence, its electric conductivity and thermal conductivity reduce. Consequently, heat 80 cannot be expelled from the LED chip 913.

[2] The high humidity influences its function significantly. Because of the cracks or separation, external air can go inside. About the cracks, they are generated in the silicon resin portion 914. As exhibited in FIG. 2, the silicon resin portion 914 generates many cracks inside, so that external air can go inside to contact with the LED chip 913. Obviously, the internal humidity increases. Furthermore, about the separation (as illustrated in FIG. 3), a gap S2 occurs between the silicon resin portion 914 and the metal plate 911, so that excess heat cannot be expelled from the LED chip 913. Hence, external air might go into these cracks or the gap S2. Not only it will generate some bubbles, but also it will influence the internal humidity condition in this LED. The cracks or gap S2 will decrease the light emitting quality and functions of this LED significantly.

Therefore, after the packing procedure of this LED, unless a destructive detecting method is taken, the internal condition of this LED cannot be known. However, such destructive detecting method cannot be used during a standard testing procedure for product quality. So, it is hard to find any potential defects of the product during the manufacturing or packing procedures.

It would therefore be desirable to invent or to develop a new product to overcome the above-mentioned problems.

SUMMARY OF THE INVENTION

It is therefore an object of the present invention to provide an LED device having a humidity sensor. It can monitor the internal condition of the LED.

It is another object of the present invention to provide an LED device having a humidity sensor. It is possible to detect both the humidity and temperature information for LED.

In order to achieve theses objects and others, a technical solution in accordance with the present invention is provided. The present invention is an LED device having a humidity sensor. It comprises:

an LED portion including a base, a boning layer, an LED chip, and a sealing portion; the LED ship being adhered on the base by the bonding layer; the sealing portion enclosing the LED chip;

a humidity sensor having an transmission element; the humidity sensor being disposed on the base for detecting humidity condition in the LED portion; and an external device connecting with the transmission element of the humidity sensor so as to monitor humidity condition and variation in the LED portion.

DETAILED DESCRIPTION OF THE PREFERRED EMBODIMENT

Figure 1:
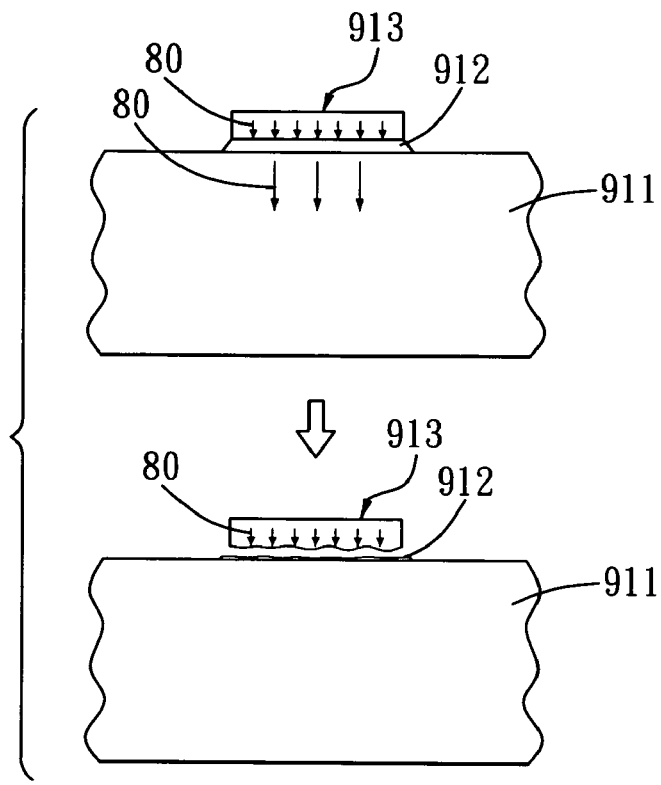
FIG. 1 shows the separating process of the LED chip inside an LED due to excess heat.
Figure 2:
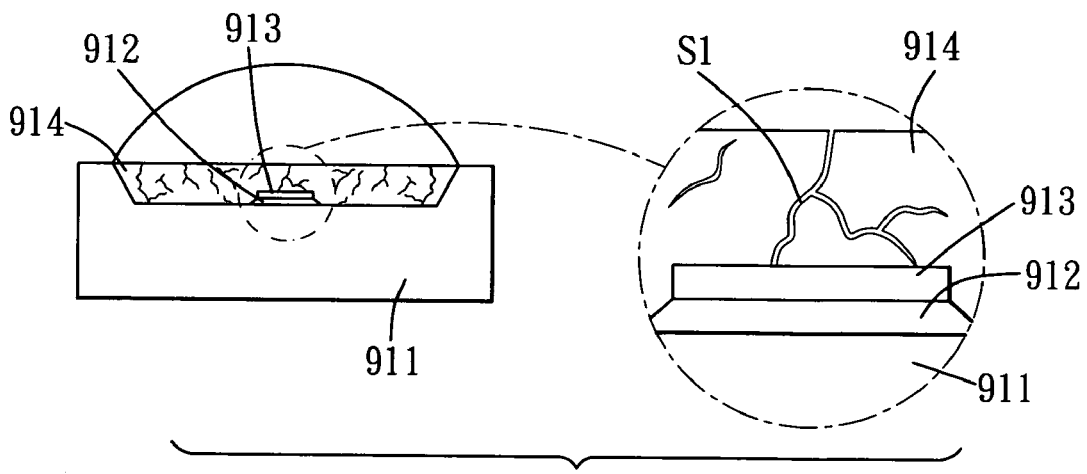
FIG. 2 illustrates a cracking process of the sealing portion inside an LED.
Figure 3:
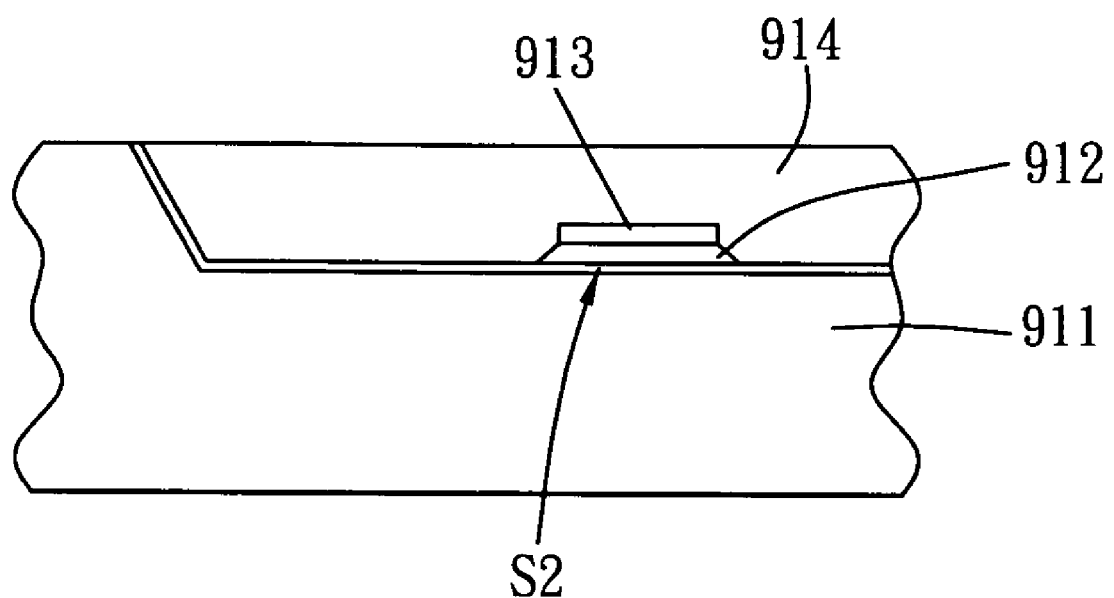
FIG. 3 is a view showing that the sealing portion separates from its base inside an LED.
Figure 4:
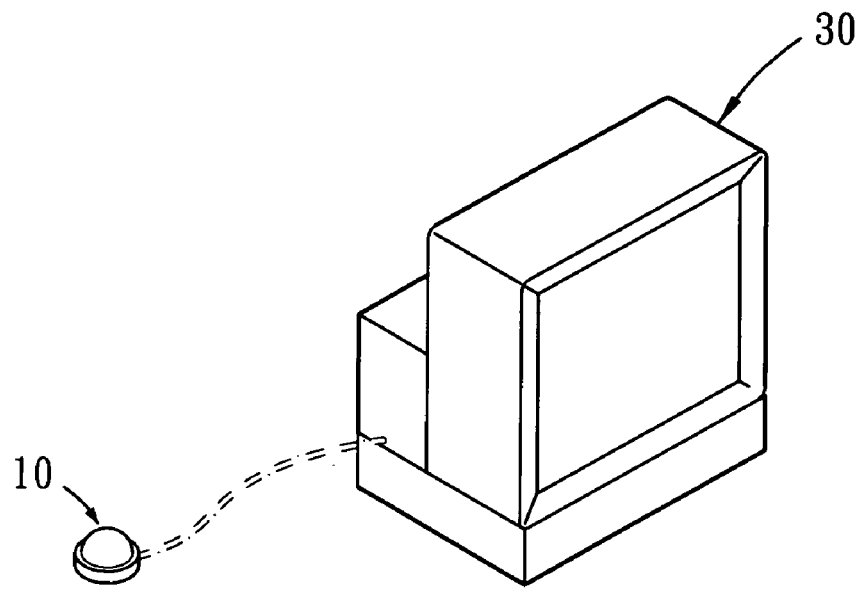
FIG. 4 is a view showing a preferred embodiment of the present invention.
Figure 5:
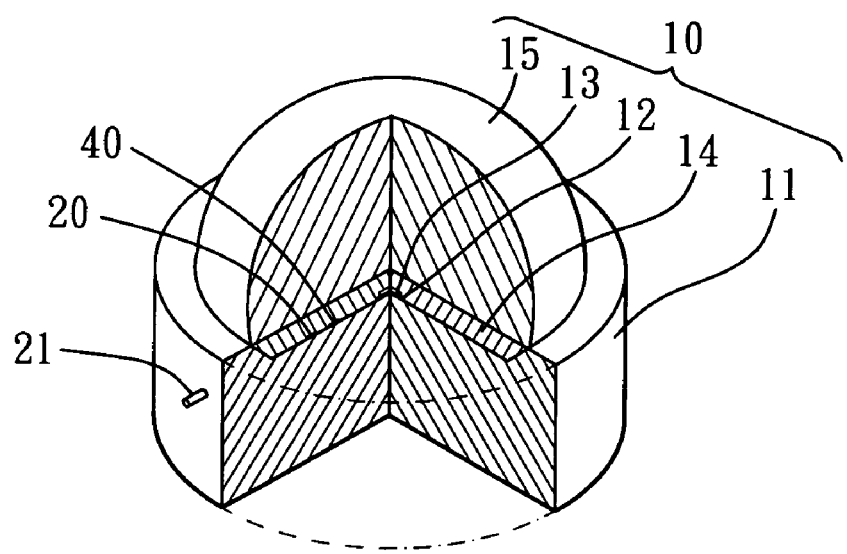
FIG. 5 is a view illustrating the inner structure of the present invention.
Figure 6:
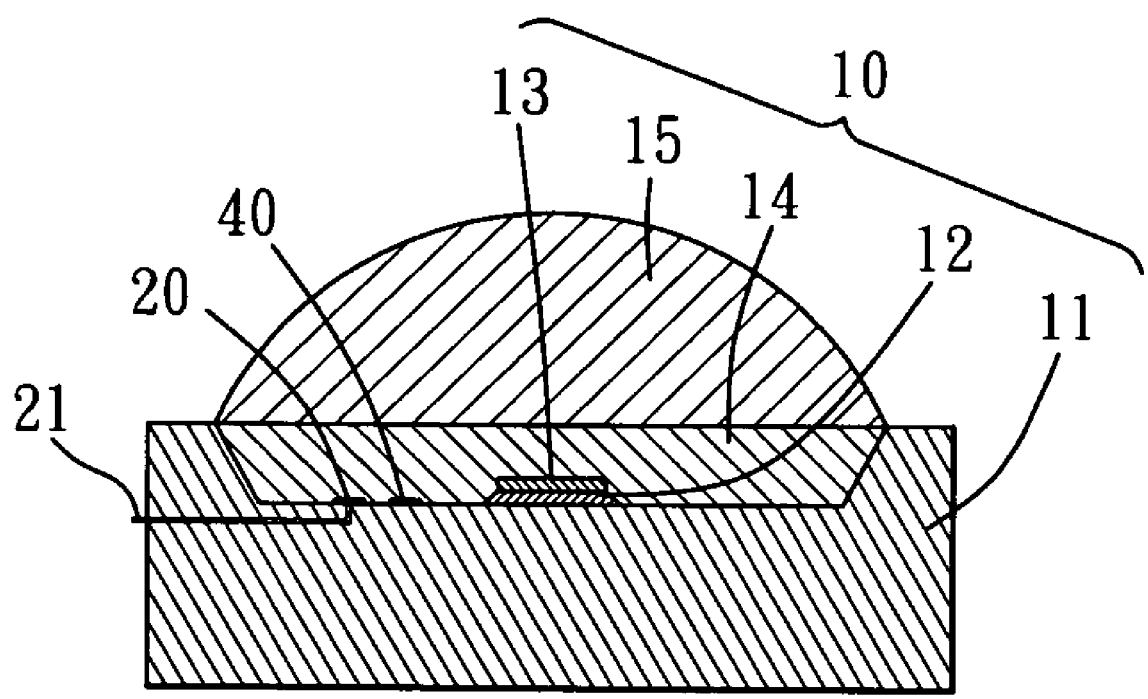
FIG. 6 is a cross-sectional view of the present invention

Referring to FIGS. 4 to 6, the present invention is an LED device having a humidity sensor comprising an LED portion 10, a humidity sensor 20, and an external device 30.

This LED portion 10 includes a base 11, a boning layer 12, an LED chip 13, and a sealing portion 14. The LED ship 12 is adhered on the base 11 by this bonding layer 12. The sealing portion 14 encloses this LED chip 13.

About this humidity sensor 20, it has a transmission element 21. This humidity sensor 20 is disposed on the base 11 for detecting humidity condition in the LED portion 10.

The external device 30, it connects with the transmission element 21 of the humidity sensor 20 so as to monitor humidity condition and variation in this LED portion 10.

With regard to the bonding layer 12, it has the functions of heat transfer and electricity conduction. For example, it can be made by silicon resin mixed with silver powder or by ceramic material with metal leads or lines (however, such manufacturing procedure is more complicated).

Concerning the sealing portion 14, it can be made by silicon resin mixed with phosphor powder.

About the humidity sensor 20, it can be integrally mounted on the base 11 via a Micro Electro Mechanical Systems (or briefly called MEMS) manufacturing procedure. Also, the humidity sensor 20 can be combined with a thermal sensor 40 (as shown in FIGS. 5 and 6) so that both of them can be integrally mounted on the base 11 via a MEMS manufacturing procedure. Under this condition, this invention can monitor both the temperature and humidity information inside the LED portion 10 simultaneously. Hence, the detected data will be more accurate.

About this invention, the bonding layer 12 (silicon resin or ceramic material mixed with silver powder) is used to adhere the LED chip 13 on the base 11. Then, the humidity sensor 20 is disposed or mounted on the base 11. Finally, the sealing portion 14 (can be made by silicon resin mixed with phosphor powder) encloses this LED chip 13. Of course, it can further comprise an outer transparent enclosing portion 15 (can be a transparent lens made by silicon resin) so that the LED chip 13 is well protected.

Furthermore, when cracks occur inside the sealing portion 14 or a gap comes out between the sealing portion 14 and the base 11 under some conditions (such as over heated, improper manufacturing process, or aging over its maximum limit), external air is possible to enter through the gap or cracks. Thus, the air makes the variation of the humidity. However, this invention utilizes the humidity sensor 20 to detect the actual humidity condition so that it is useful to know the degree of damage of the sealing portion 14. Of course, it is optional to add another thermal sensor 40 to monitor its actual temperature (usually this thermal sensor 40 is installed between the base 10 and the LED chip 13). Hence, it is possible to find out the maximum allowable temperature.

Preferably, the thermal sensor 40 can be integrally mounted on the base 10 via a Micro Electro Mechanical Systems (MEMS) manufacturing procedure.

In addition, before this thermal sensor 40 is used, it needs to be calibrated. First, it can be placed inside a testing equipment having a stable environment with predetermined constant temperature and constant humidity. Then, the user can gradually increase or decrease the temperature and humidity gradually and record the corresponding electric signals measured. Finally, a reliable relationship between the electric signals and the corresponding temperature/humidity can be established. In addition, interpolation technique can be utilized, if required. So, the detected resistance value or capacitance value can be converted into a corresponding temperature or humidity level.

The advantages and function of this invention can be summarized as follows.

[1] It can monitor the internal condition in the LED portion. About the prior art, it cannot monitor the internal condition in the LED portion to know the actual heat distribution and aging condition of that material. In order to solve this problem, this invention utilizes a humidity sensor to know the humidity variation when there is a crack or a gap allowing external air goes inside. Hence, based on the detected humidity condition, the damage condition inside the LED portion can be known.

[2] It is possible to detect both the temperature and humidity simultaneously. Both of the humidity sensor and the thermal sensor can be integrally mounted on the base via a MEMS manufacturing procedure. Under this condition, this invention can monitor the temperature and humidity information inside the LED portion. Also, the material's maximum allowable limit can be found.

While this invention has been particularly shown and described with references to the preferred embodiments thereof, it will be understood by those skilled in the art that various changes or modifications can be made therein without departing from the scope of the invention by the appended claims.

What is claimed is:

1. An LED device having a humidity sensor comprising:
   an LED portion including a base, a boning layer, an LED chip, and a sealing portion; said LED ship being adhered on said base by said bonding layer; said sealing portion enclosing said LED chip;
   a humidity sensor having an transmission element; said humidity sensor being disposed on said base for detecting humidity condition in said LED portion; and
   an external device connecting with said transmission element of said humidity sensor so as to monitor humidity condition and variation in said LED portion.

2. The LED having a humidity sensor as claimed in claim 1, wherein said humidity sensor is integrally mounted on said base via a Micro Electro Mechanical Systems manufacturing procedure.

3. The LED having a humidity sensor as claimed in claim 1, further comprising a thermal sensor.

4. The LED having a humidity sensor as claimed in claim 1, further comprising a thermal sensor, and said thermal sensor being integrally mounted on said base via a Micro Electro Mechanical Systems manufacturing procedure.

5. The LED having a humidity sensor as claimed in claim 1, further comprising an outer transparent enclosing portion.

* * * * *